United States Patent
Kim et al.

[11] Patent Number: 5,958,607
[45] Date of Patent: Sep. 28, 1999

[54] LEAD FRAME FOR SEMICONDUCTOR DEVICE

[75] Inventors: Joong-do Kim; Young-ho Baek, both of Kyungki-do, Rep. of Korea

[73] Assignee: Samsung Aerospace Industries, Ltd., Kyongsangnam-do, Rep. of Korea

[21] Appl. No.: 08/823,691

[22] Filed: Mar. 25, 1997

[30] Foreign Application Priority Data

Mar. 26, 1996 [KR] Rep. of Korea ..................... 96-8362

[51] Int. Cl.⁶ ..................... H01L 23/495; B32B 15/20
[52] U.S. Cl. ..................... 428/675; 428/620; 428/670; 428/672; 428/674; 428/929; 257/666; 257/677
[58] Field of Search ..................... 428/615, 620, 428/668, 672, 675, 670, 674, 929; 257/666, 677

[56] References Cited

U.S. PATENT DOCUMENTS

| | | | |
|---|---|---|---|
| 4,699,697 | 10/1987 | Higuchi | 428/670 |
| 4,985,310 | 1/1991 | Agarwala et al. | 428/620 |
| 5,510,197 | 4/1996 | Takahashi et al. | 428/673 |
| 5,618,576 | 4/1997 | Baek | 427/96 |
| 5,684,329 | 11/1997 | Serizawa | 428/620 |
| 5,750,016 | 5/1998 | Moon | 428/670 |
| 5,767,574 | 6/1998 | Kim et al. | 257/677 |

FOREIGN PATENT DOCUMENTS 6-112389  4/1994  Japan .

*Primary Examiner*—Deborah Jones
*Assistant Examiner*—Cathy F. Lam
*Attorney, Agent, or Firm*—Finnegan, Henderson, Farabow, Garrett & Dunner, L.L.P.

[57] ABSTRACT

A lead frame has a metal substrate directly coated with a palladium alloy layer to prevent diffusion of metal molecules from the metal substrate. The lead frame does not contain a nickel intermediate layer, thereby preventing the diffusion of nickel molecules which makes soldering difficult, and enhancing production.

4 Claims, 2 Drawing Sheets

LEAD FRAME FOR SEMICONDUCTOR DEVICE

BACKGROUND OF THE INVENTION

The present invention is directed to a lead frame, and a manufacturing method therefor, with minimal susceptibility to metal diffusion and cracking.

Lead frames come in a variety of forms and are generally used to mount semiconductor chips. FIG. 1 is a diagram of a general lead frame.

FIG. 1 shows lead frame 10, including coined portion 11, pad portion 12, and outer lead 13. Coined portion 11 and pad portion 12 are usually silver-plated. Outer lead 13, on the other hand, is generally solder-plated using a tin (Sn)-lead (Pb) alloy to enhance its solderability after resin-molding in the semiconductor package process.

Resin-molded products undergo a wet treatment for the solder plating. The wet treatment deteriorates the reliability of the products considerably. Accordingly, to solve this problem, a plate layer of the lead frame is coated to withstand the wet treatment before beginning the semiconductor package process.

FIG. 2 is a sectional view of lead frame 20 that has undergone the above coating process. Lead frame 20 contains a copper (Cu) substrate 21 coated with a nickel (Ni) layer 22. The Ni layer 22 is coated with a palladium (Pd)—Ni alloy layer 23, which, in turn, is coated with a Pd layer 24.

The Ni layer 22 acts as a barrier layer to the diffusion of Cu molecules in order to prevent the Cu molecules from diffusing to the outermost surface of lead frame 20 and thereby generating a Cu compound such as a sulfide. If the thickness of the Ni layer 22 is less than 400 micro-inches, however, the Cu molecules diffuse through the porosities existing in the Ni layer 22. If the thickness of the Ni layer 22 is more than 400 micro-inches, the Ni layer 22 cracks when lead frame 20 is bent.

FIG. 3 is a sectional view of lead frame 30 that has been developed to prevent diffusion of Cu molecules through the porosities. FIG. 3 uses similar reference numerals to those used in FIG. 2 to designate layers that are shown in FIG. 2.

Lead frame 30 includes Cu substrate 21, coated with a Ni strike layer 25 having a thickness of approximately 5 micro-inches. The Ni strike layer 25 is coated with a Pd—Ni alloy layer 23 having a thickness of approximately 3 micro-inches. Despite this structure, lead frame 30 cannot prevent discoloration of the lead frame surface and deterioration of solderability, because a Cu compound, such as an oxide or a sulfide, is still generated at the outermost surface of lead frame 30.

FIG. 4 is a sectional view of lead frame 40 with an enhanced structure. FIG. 4 uses similar reference numerals to those used in FIGS. 2 and 3 to designate layers that are also shown in FIGS. 2 or 3.

Lead frame 40 includes a gold (Au) strike layer 26 acting as an adhesive layer between a Ni layer 22 and a Pd—Ni alloy layer 23 to bond the two layers together. The Pd—Ni alloy layer 23 is coated with a Pd layer 24 for trapping Ni molecules diffusing from the Pd—Ni alloy layer 23. The Pd layer 24 is coated with an Au layer 27 to reduce porosities and enhance solderability and wire bonding.

In each of the above-described conventional methods, an intermediate layer is formed of Ni or a Pd—Ni alloy to prevent Cu molecules of the substrate from diffusing outward. However, Ni molecules diffuse from the intermediate layer with the Cu molecules. As a result, Ni or an Ni compound, such as Ni oxide, is generated at the outermost surface of the lead frame due to diffusion of Ni molecules. This hampers solderability more severely than Cu or a Cu compound. For example, when Ni of approximately 5% exists at the outermost surface of the lead frame, solderability is remarkably decreased. In addition, Ni oxide cannot be easily removed by surface washing.

Accordingly, it is desirable to plate a surface of a lead frame with only Pd. However, this tends to be expensive and the adhesiveness of Pd is low.

Japanese Patent Laid-Open Gazette No. 6-112389 to Hitachi Co. discloses a Pd plating method by which the surface of the lead frame is heat-treated and a diffusion double layer is formed on a Pd interface to enhance its adhesiveness. The heat-treating required in the above plating method, however, lowers productivity and causes a surface of the lead frame to become oxidized, thereby deteriorating solderability and wire bonding.

Moreover, if the total thickness of the plated layer is approximately 100 to 1,000 micro-inches, problems arise in the semiconductor package process. For example, when bending the lead during trimming and forming of the outer lead, structural defects, such as cracks in an intermediate layer and separation of the layers, result. Moreover, because the cracks increase in proportion to the thickness of the plated layer, there is a limit as to how much the thickness of the plated layer can be increased.

In addition, the closer the plated layer of the lead frame comes to the outer lead portion from the pad, the thicker the plated layer becomes. As the thickness of the plated layer increases, the variation in the thickness with respect to each portion of the lead frame increases. Accordingly, it is difficult to control the desired thickness of the plating.

In multi-layered plating, the above-described problems are severe, resulting in a decrease in production and an increase in production costs.

SUMMARY OF THE INVENTION

Accordingly, it is an object of the present invention to provide a lead frame that eliminates the conventional intermediate layer that causes metal diffusion and cracking. It is another object of the present invention to provide a manufacturing method for the inventive lead frame.

To accomplish the first object, there is provided a lead frame having a metal substrate and a Pd alloy layer coated directly on the metal substrate to a predetermined thickness.

To accomplish the second object, there is provided a manufacturing method for a lead frame. The manufacturing method includes the steps of defatting and activating a surface of a metal substrate of the lead frame, and directly coating the metal substrate with a Pd alloy layer to a predetermined thickness.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The following detailed description of the invention refers to the accompanying drawings that illustrate preferred embodiments consistent with the principles of this invention. Other embodiments are possible and changes may be made to the embodiments without departing from the spirit and scope of the invention. The following detailed description does not limit the invention. Instead, the scope of the invention is defined only by the appended claims.

Figure 5:
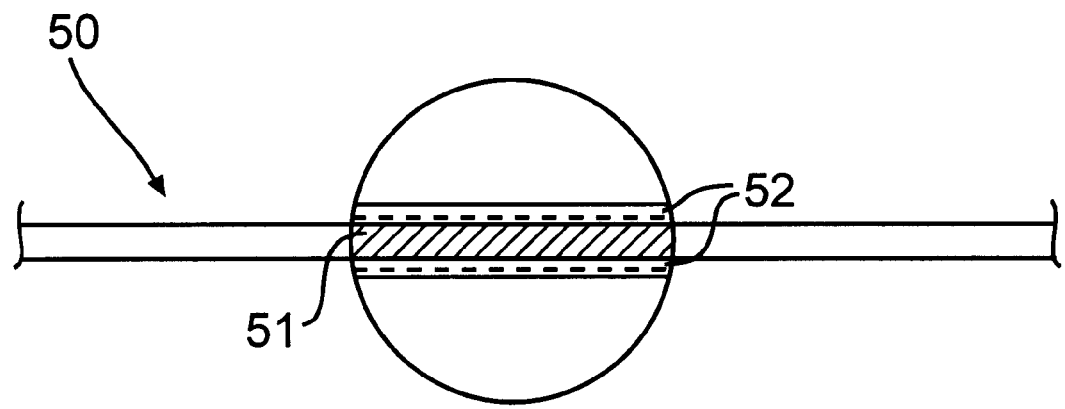
FIG. 5 is a sectional view showing a structure of a lead frame according to the present invention.

FIG. 5 is a sectional view of lead frame 50 consistent with the principles of the present invention. Lead frame 50 includes metal substrate 51 and a Pd alloy layer 52, coating metal substrate 51. Metal substrate 51 is Cu, a Cu alloy, or a nickel alloy, and has a thickness of 0.1 to 3.0 mm. Metal substrate 51 is coated with the Pd alloy layer 52 after defatting and activating.

Figure 1:
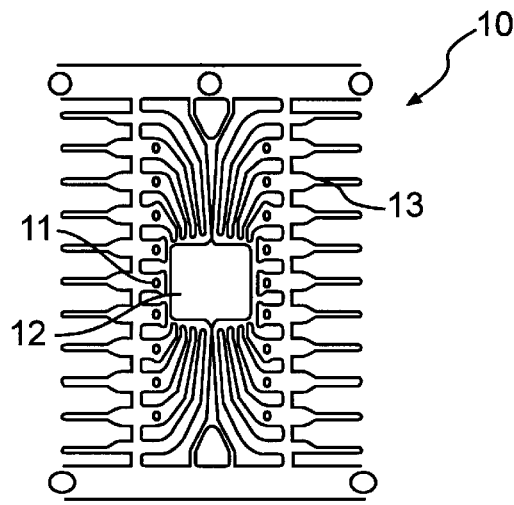
FIG. 1 is a perspective view showing a structure of a typical lead frame.
Figure 2:
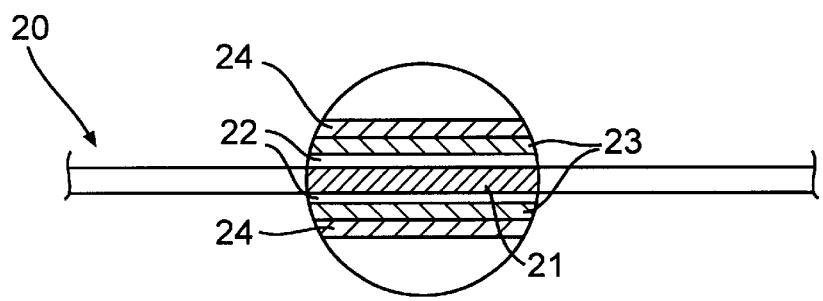
FIG. 2 is a sectional view showing a structure of a first conventional lead frame.
Figure 3:
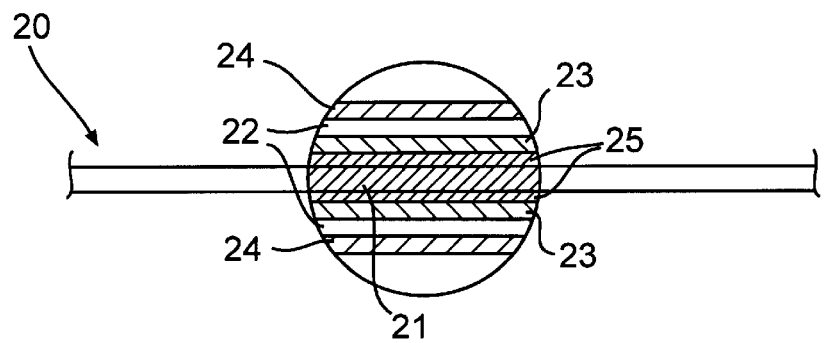
FIG. 3 is a sectional view showing a structure of a second conventional lead frame.
Figure 4:
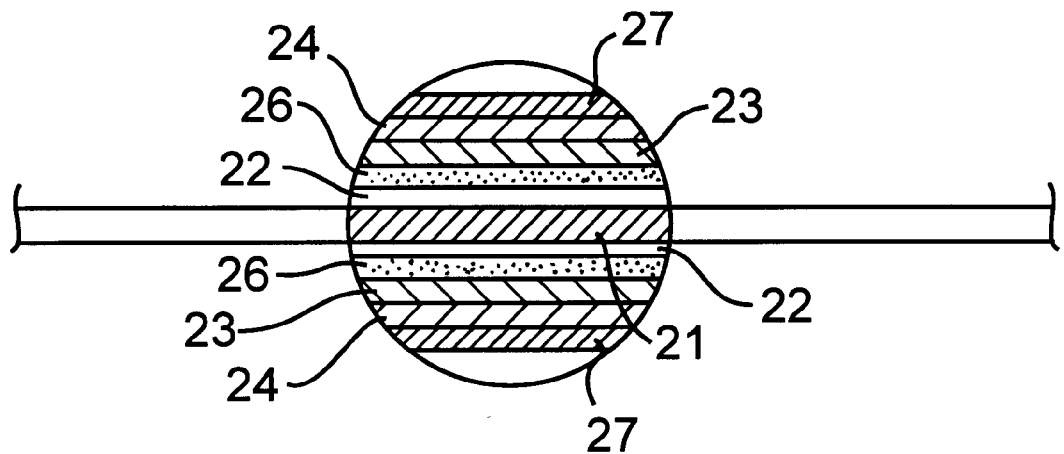
FIG. 4 is a sectional view showing a structure of a third conventional lead frame.

The corrosion resistance of the Pd alloy layer 52 is better than the corrosion resistance of the Pd alloy layer 24 of FIG. 2. This is because a smaller amount of hydrogen diffuses into the Pd layer 24 than diffuses into the Pd alloy layer 52 during formation of the plated layer. The Pd alloy layer 52 preferably comprises an alloy selected from a group of alloys, including a Pd—Au alloy, a Pd-cobalt (Co) alloy, a Pd-tungsten (W) alloy, a Pd-silver (Ag) alloy, a Pd-titanium. (Ti ) alloy, a Pd-molybdenum (Mo) alloy, and a Pd-Sn alloy. Pd preferably has at least a 50% concentration in these alloys.

The Pd alloy layer 52 has a thickness within a range of 0.1 to 2.0 $\mu$m, but preferably has a thickness between 0.5 to 1.0 pm.

The thickness of the Pd alloy layer 52 depends on the type of metal making up the alloy. For example, in the case of a Pd—Au alloy, as the amount of added gold increases, the optimum thickness of the Pd alloy layer 52 decreases.

According to the present invention, intermediate layers 22 and 23 of FIG. 2, which include Ni, are eliminated, thereby preventing diffusion of Ni molecules which causes a decrease in solderability. Because eliminating the intermediate layers also eliminates the plating process for forming these layers, lead frame production increases. Furthermore, when the metal substrate is coated with a Pd—Au alloy layer, using, for example, a wet plating process, such as electroplating, Au composites exist at the outermost layer of the lead frame, thereby enhancing wire bonding.

EXAMPLE

In the following example, a metal substrate surface of a lead frame processed by defatting and activating was coated with a Pd—Au alloy layer so that the thickness of a plated layer at an outer lead portion was approximately 0.5 $\mu$m. The Au composition in the Pd—Au plating solution was 25 wt %. A current of 1.0 A was applied to the plating solution to form the plated layer.

Several tests, including a solderability test, a wire bonding test, and a salt spray test based on U.S. military specifications were performed on the metal substrate. In order to compare and analyze the results of the tests, a metal substrate coated with a Ni intermediate layer, formed by applying a current of 1.0 A to a nickel sulfamate solution, which is coated with a Pd layer (comparison 1) and a Pd—Au layer (comparison 2), also underwent the tests.

In the solderability test, solderability is measured with a different flux according to a 2003.7 method based on the military standard specification 883D. For the lead frame package, a small outline J-form banding (SOJ) type having 20 pins was used.

An area coated with lead with respect to a predetermined lead area is shown by percentage as follows:

|  | PRESENT INVENTION | COMPARISON 1 | COMPARISON 2 |
|---|---|---|---|
| FLUX 1 ($\alpha$-100) | 95% | 87% | 92% |
| FLUX 2 (S-36) | 98% | 90% | 92% |
| FLUX 3 (ULF-300) | 100% | 100% | 100% |

In the wire bonding test, UTC-200 was used for the equipment and a normal type Geiser 1572-17-43GM-20D was used for capillary. The wire used for the example had a diameter of 1.2 mm and a heating temperature of 230° C. Bonding strength of the bonded wire is shown by the average tension force (gf) as follows:

|  | PRESENT INVENTION | COMPARISON 1 | COMPARISON 2 |
|---|---|---|---|
| AVERAGE TENSION FORCE (gf) | 9.10 | 8.07 | 8.37 |

In the salt spray test, corrosion resistance is tested using a 1009.8 method based on the military standard specification 883D. The percentage of an uncorroded area is shown as follows:

|  | PRESENT INVENTION | COMPARISON 1 | COMPARISON 2 |
|---|---|---|---|
| UNCORRODED AREA ON PAD | 99% | 91% | 95% |

As shown by the above test results, solderability, wire bonding, and corrosion resistance are better according to the lead frame of the present invention than the lead frames of the comparisons.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. The scope of the invention is defined by the claims and their equivalents.

What is claimed is:

1. A lead frame comprising:
   a metal substrate including one of Cu and Cu alloy; and
   a Pd—Au alloy layer coated directly on said metal substrate to a predetermined thickness within a range of 0.1 to 1.0 $\mu$m.

2. The lead frame of claim 1, wherein said Pd—Au alloy layer includes a concentration of Pd of at least 50%.

3. The lead frame of claim 1, wherein said metal substrate has a thickness within a range of 0.1 to 3.0 mm.

4. The lead frame of claim 1, wherein the Pd—Au alloy layer is coated on the metal substrate without any intermediate layer.

* * * * *

UNITED STATES PATENT AND TRADEMARK OFFICE
CERTIFICATE OF CORRECTION

PATENT NO.: 5,958,607
DATED: September 28, 1999
INVENTOR(S): Joong-do KIM et al.

It is certified that an error appears in the above-identified patent and that said Letters Patent is hereby corrected as shown below:

Claim 1, Column 4, line 55, before "thickness", delete "predetermined".

Signed and Sealed this

Twelfth Day of September, 2000

Attest:

Q. TODD DICKINSON

Attesting Officer          Director of Patents and Trademarks